(12) United States Patent
Colli

(10) Patent No.: US 10,312,398 B2
(45) Date of Patent: Jun. 4, 2019

(54) SENSING APPARATUS

(71) Applicant: EMBERION OY, Espoo (FI)

(72) Inventor: Alan Colli, Cambridge (GB)

(73) Assignee: EMBERION OY, Espoo (FI)

( * ) Notice: Subject to any disclaimer, the term of this patent is extended or adjusted under 35 U.S.C. 154(b) by 62 days.

(21) Appl. No.: 15/523,104

(22) PCT Filed: Oct. 20, 2015

(86) PCT No.: PCT/FI2015/050709
§ 371 (c)(1),
(2) Date: Apr. 28, 2017

(87) PCT Pub. No.: WO2016/066887
PCT Pub. Date: May 6, 2016

(65) Prior Publication Data
US 2018/0287004 A1     Oct. 4, 2018

(30) Foreign Application Priority Data
Oct. 31, 2014  (EP) ..................................... 14191383

(51) Int. Cl.
*G01J 5/10*          (2006.01)
*H01L 31/113*        (2006.01)
(Continued)

(52) U.S. Cl.
CPC ............ *H01L 31/113* (2013.01); *G01J 5/046* (2013.01); *G01J 5/10* (2013.01); *G01J 5/34* (2013.01);
(Continued)

(58) Field of Classification Search
CPC .... G01J 5/34; G01J 5/046; G01J 5/406; G01J 5/10; H01L 31/113
See application file for complete search history.

(56) References Cited

U.S. PATENT DOCUMENTS

| 4,110,616 A | 8/1978 | Porter et al. |
| 4,608,865 A | 9/1986 | Muller et al. |

(Continued)

FOREIGN PATENT DOCUMENTS

| DE | 41 05 591 C1 | 4/1992 |
| GB | 2 021 761 | 12/1979 |

(Continued)

OTHER PUBLICATIONS

Annex to the European Search Report dated Apr. 28, 2015 corresponding to European Patent Application No. 14191383.
(Continued)

*Primary Examiner* — Yara B Green
(74) *Attorney, Agent, or Firm* — Squire Patton Boggs (US) LLP

(57) ABSTRACT

An apparatus comprising: pyroelectric material; an electric field sensor; a first conductive electrode comprising a first area adjacent the pyroelectric material; a second conductive electrode comprising a second area adjacent the electric field sensor; and a conductive interconnection between the first conductive electrode and the second conductive electrode, wherein the first area of the first conductive electrode is larger than the second area of the second conductive electrode.

8 Claims, 4 Drawing Sheets

(51) Int. Cl.
  *G01J 5/04* (2006.01)
  *G01J 5/34* (2006.01)
  *H01L 29/423* (2006.01)
  *H01L 29/778* (2006.01)
  *H01L 29/16* (2006.01)
  *H01L 31/0352* (2006.01)
  *H01L 31/119* (2006.01)
  *H01L 21/04* (2006.01)
  *H01L 29/786* (2006.01)
  *H01L 29/40* (2006.01)

(52) U.S. Cl.
  CPC ........ *H01L 21/041* (2013.01); *H01L 29/1606* (2013.01); *H01L 29/4238* (2013.01); *H01L 29/42384* (2013.01); *H01L 29/778* (2013.01); *H01L 29/78603* (2013.01); *H01L 29/78645* (2013.01); *H01L 29/78684* (2013.01); *H01L 29/78696* (2013.01); *H01L 31/035218* (2013.01); *H01L 31/119* (2013.01); *H01L 29/404* (2013.01)

(56) References Cited

U.S. PATENT DOCUMENTS

| | | | |
|---|---|---|---|
| 7,652,317 B2 | 1/2010 | Watanabe | |
| 7,821,054 B2 | 10/2010 | Watanabe | |
| 2007/0158699 A1 | 7/2007 | Watanabe et al. | |
| 2009/0015491 A1 | 1/2009 | Ikeda et al. | |
| 2009/0321807 A1 | 12/2009 | Watanabe | |
| 2011/0147723 A1* | 6/2011 | Hodges, Jr. | H01L 51/0529 257/40 |
| 2016/0305824 A1* | 10/2016 | Ozyilmaz | G01J 5/34 |
| 2017/0162704 A1* | 6/2017 | Abe | H01L 29/78609 |

FOREIGN PATENT DOCUMENTS

| | | |
|---|---|---|
| JP | 2599354 B2 | 4/1997 |
| JP | 3018174 B1 | 3/2000 |

OTHER PUBLICATIONS

International Search Report and Written Opinion dated Jan. 29, 2016 corresponding to International Patent Application No. PCT/FI2015/050709.

Alessandro Tredicucci et al., "Device Concepts for Graphene-Based Terahertz Photonics," IEEE Journal of Selected Topics in Quantum Electronics, IEEE, vol. 20, No. 1, Jan. 1, 2014, p. 8500109, XP011526240.

International Search Report & Written Opinion dated Feb. 17, 2016 corresponding to International Patent Application No. PCT/FI2015/050732.

European Search Report dated Oct. 7, 2015 corresponding to European Patent Application No. 15161553.1.

Cher Xuan Zhang et al., "Electrical Stress and Total Ionizing Dose Effects on Graphene-Based Non-Volatile Memory Devices," IEEE Transactions on Nuclear Science, vol. 59, No. 6, Dec. 2012, pp. 2974-2978, XP011487520.

International Search Report & Written Opinion dated Jan. 29, 2016 corresponding to International Patent Application No. PCT/FI2015/050719.

European Search Report dated Mar. 1, 2016 corresponding to European Patent Application No. 15173329.2.

Zhenhua Sun et al., "Infrared Photodetectors Based on CVD-Grown Graphene and PbS Quantum Dots with Ultrahigh Responsivity," Advanced Materials, vol. 24, No. 43, Nov. 14, 2012, pp. 5878-5883, XP055243035.

U.S. Office Action issued in corresponding U.S. Appl. No. 15/523,476 dated Oct. 1, 2018.

* cited by examiner

SENSING APPARATUS

TECHNOLOGICAL FIELD

A sensing apparatus and in particular an electrical sensing apparatus.

BACKGROUND

A sensing apparatus senses an ambient parameter and produces an output. An electrical sensing apparatus produces an electrical output.

It is desirable to produce better sensing apparatus.

BRIEF SUMMARY

According to various, but not necessarily all, examples of one embodiment in the disclosure there may be provided an apparatus comprising: pyroelectric material; an electric field sensor; a first conductive electrode comprising a first area adjacent the pyroelectric material; a second conductive electrode comprising a second area adjacent the electric field sensor; and a conductive interconnection between the first conductive electrode and the second conductive electrode, wherein the first area of the first conductive electrode is larger than the second area of the second conductive electrode.

According to various, but not necessarily all, examples of another embodiment of the disclosure there is provided an apparatus comprising: sensing material having a polarization that changes in response to an applied actuation; an electric field sensor; a first conductive electrode comprising a first area adjacent the sensing material; a second conductive electrode comprising a second area adjacent the electric field sensor; a conductive interconnection between the first conductive electrode and the second conductive electrode, wherein the first area is larger than the second area.

In this embodiment, the sensing material may, for example, be a pyroelectric material or may be, for example, be a piezoelectric material having a polarization that changes in response to deformation.

A pyroelectric material have a polarization that changes in response to heat transfer. The heat may be transferred from incident photons.

According to various, but not necessarily all, examples of the disclosure the second conductive electrode and the conductive interconnection, in combination, form an electrically isolated or electrically isolatable amplifying electrode.

According to various, but not necessarily all, examples of the disclosure the pyroelectric material and the first conductive electrode form a first capacitor having a first electric field dependent upon a polarization of the pyroelectric material (or sensing material) and wherein the first electric field causes, at the second conductive electrode, a second electric field that is dependent upon the first electric field amplified by a ratio of the first area to the second area.

According to various, but not necessarily all, examples of the disclosure the first area is at least ten times larger than the second conductive area and optionally at least fifty times larger than the second conductive area.

According to various, but not necessarily all, examples of the disclosure the electric field sensor has a channel conductivity between a source and a drain that is dependent upon an electric field at the adjacent second conductive electrode.

According to various, but not necessarily all, examples of the disclosure the electric field sensor is an insulated gate field effect transistor, wherein the second conductive electrode provides an insulated gate.

According to various, but not necessarily all, examples of the disclosure the electric field sensor comprises graphene.

According to various, but not necessarily all, examples of the disclosure the first conductive electrode, the second conductive electrode and the conductive interconnection, in combination, are formed from a common material.

According to various, but not necessarily all, examples of the disclosure the second conductive electrode is formed from metal, semiconductor, 2D material, ionic-liquid, ionic gel.

According to various, but not necessarily all, examples of the disclosure the apparatus comprises a photon absorbing layer for absorbing photons and generating heat in or adjacent the pyroelectric material.

According to various, but not necessarily all, examples of the disclosure the photon absorbing layer overlies the pyroelectric layer and is the first conductive electrode or overlies the first conductive electrode.

According to various, but not necessarily all, examples of the disclosure the photon absorbing layer is a micro-engineered layer than operates as an antenna for absorbing electromagnetic wavelength of a particular frequency or frequencies.

According to various, but not necessarily all, examples of the disclosure the pyroelectric material (or sensing material) extends adjacent the electric field sensor and is configured to provide a third electric field, dependent upon a polarization of the pyroelectric material (or sensing material), for sensing by the electric field sensor.

According to various, but not necessarily all, examples of the disclosure, the first area of the first conductive electrode overlies a first area of the pyroelectric material; the second area of the second conductive electrode overlies a second area of the pyroelectric material; a graphene layer of the electric field sensor extends over and is in contact with the first area of the pyroelectric material and does not extend over the second area of the pyroelectric material; dielectric extends over at least the graphene layer; and patterned conductive material overlying the first area of the pyroelectric material to form the first conductive electrode, overlying the second area of the pyroelectric material to form the second conductive electrode and overlying an area between the first area and the second area to form the interconnection. In other embodiments, the pyroelectric material may be a sensing material.

According to various, but not necessarily all, examples of the disclosure the apparatus is configured as a suspended structure.

One or more apparatuses may be housed in a device. The device may be configured to operate as a photodetector, a microblometer, an infrared camera etc.

BRIEF DESCRIPTION

For a better understanding of various examples that are useful for understanding the detailed description, reference will now be made by way of example only to the accompanying drawings in which.

DETAILED DESCRIPTION

Figure 1:
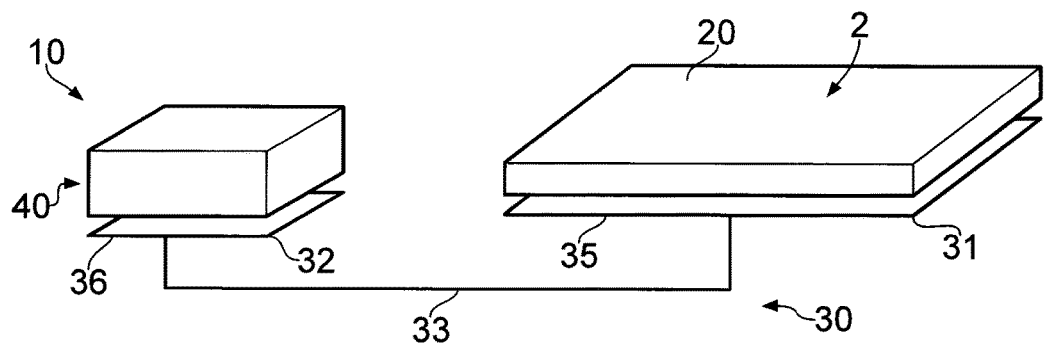
FIG. 1 illustrates an example of an apparatus comprising sensing material.

This disclosure relates in general to an apparatus 10 comprising: sensing material 20 having a polarization that changes in response to an applied actuation 2; an electric field sensor 40; a first conductive electrode 31 comprising a first area 35 adjacent the sensing material 20, a second conductive electrode 32 comprising a second area 36 adjacent the electric field sensor 40, and a conductive interconnection 33 between the first conductive electrode 31 and the second conductive electrode 32, wherein the first area 35 is larger than the second area 36.

The sensing material 20 may be a pyroelectric material.

FIG. 1 illustrates an apparatus 10 comprising: pyroelectric material 20; an electric field sensor 40; a first conductive electrode 31 comprising a first area 35 adjacent the pyroelectric material 20, a second conductive electrode 32 comprising a second area 36 adjacent the electric field sensor 40, and a conductive interconnection 33 between the first conductive electrode 31 and the second conductive electrode 32, wherein the first area 35 of the first conductive electrode 31 is larger than the second area 36 of the second conductive electrode 32.

The apparatus 10 is configured to convert a response of the pyroelectric material 20 into an output electrical signal from the electric field sensor 40.

The combination of the first conductive electrode 31, the second conductive electrode 32 and the conductive interconnection 33 operate to amplify an electrostatic voltage at the first conductive electrode 31 to a larger electrostatic voltage at the second conductive element 32. The electrostatic voltage at the first conductive electrode 31 is a result of polarization changes at the pyroelectric material 20 in response to a temperature change at the pyroelectric material 20. The combination will therefore be referred to as an amplification electrode 30.

The amplification electrode 30 may be electrically isolated or electrically isolatable. That is, it is a floating electrode that may be permanently electrically isolated or switched to become electrically isolated. The purpose of the isolation is that the amplification electrode 30 is a closed electrical circuit that conserves charge. There is no direct current path between the amplification electrode 30 and the electric field sensor 40.

Figure 2:
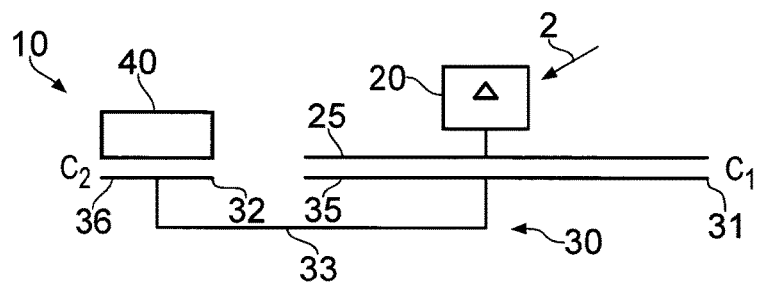
FIG. 2 illustrates an equivalent circuit diagram for the apparatus illustrated in FIG. 1.

FIG. 2 illustrates an equivalent circuit diagram for the apparatus 10 illustrated in FIG. 1.

A change in temperature at the pyroelectric material 20 causes a change in polarisation of the pyroelectric material 20. This causes a change $\Delta\sigma$ in the charge distribution within the pyroelectric material 20 and so causes a change in the local electric field around the pyroelectric material 20.

The pyroelectric material 20 and the first conductive electrode 31 form a first capacitor C1. The first capacitor C1 has an effective area A1 corresponding to the first area 35 of the first conductive electrode 31. The first capacitor C1 stores a charge Q1 over the area A1 and develops a voltage V1.

The electric field sensor 40 and the second conductive electrode 32 may form a second capacitor C2. The second capacitor C2 has an effective area A2 corresponding to the second area 36 of the second conductive electrode 32. The second capacitor C2 stores a charge Q2 over the area A2 and develops a voltage V2.

At a certain temperature T, the pyroelectric substrate produces a fixed amount of charge per unit area, indicated as $\sigma(T)$.

A first voltage V1 generated at the first capacitor C1 does not depend on the geometry of C1 (V1=Q1/C1 with Q1=$\sigma$(T)*A1. If the area A1 doubles, both Q1 and C1 double and V1 stays constant.

The charge Q1 needed at C1 to screen the pyroelectric charge $\sigma$(T)*A1 must come from C2, as the amplification electrode 30 is a floating circuit with no access to an external charge reservoir. As capacitors C1 and C2 are in series, Q2=Q1 must hold at all times, hence the second voltage V2=Q2/C2=Q1/C2=V1*C1/C2.

The second voltage V2 scales with the capacitance ratio C1/C2. It is therefore desirable for C1>>C2, this may be achieved by making the first area A1 larger than the second area A2.

It may also be improved or maintained by having the capacitive coupling greater (or not significantly worse) for the first capacitor C1 than the second capacitor C2.

The first area A1 may be at least ten times larger than the second area A2 and optionally at least fifty times larger than the second area A2.

Thus pyroelectric material 20 and the first conductive electrode 31 form a first capacitor C1 having a first electric field dependent upon a polarization of the pyroelectric material. The first electric field causes, at the second conductive electrode 32, a second electric field that is dependent upon the first electric field amplified by a ratio of the first area to the second area.

The pyroelectric material 20 may comprise any suitable material which provides a change in charge distribution in response a temperature change. Examples of suitable materials include Lead Zirconate Titanate (PZT), Lithium Tantalate (LiTaO$_3$), Lithium Niobate (LiNbO$_3$), Strontium Barium Niobate (SrBaNb$_2$O$_6$), Gallium Nitride (GaN), Caesium Nitrate (CsNO$_3$), polymers such as polyvinyl fluoride or any other material.

In some examples the pyroelectric material 20 may also be deformable and/or transparent.

The amplification electrode 30 may be formed as separated interconnected components or as a single integral component, for example, as a patterned layer of the same material.

The amplification electrode 30 or parts of the amplification electrode 30 may be formed from metal, semiconductor, 2D material, ionic-liquid, ionic gel.

In some examples the amplification electrode 30 may also be deformable and/or transparent.

The apparatus 10 has a large thermal coefficient of resistance (TCR) and may be used to detect minute changes in temperature.

Figure 3:
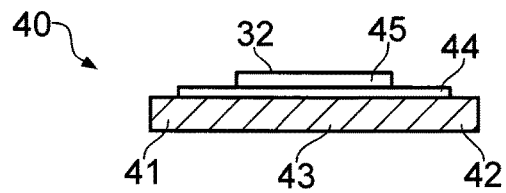
FIG. 3 illustrates an example of an electric field sensor.

FIG. 3 illustrates an example of an electric field sensor 40. In this example, but not necessarily all examples the electric field sensor 40 is a transconductance electric field sensor.

The electric field sensor 40 comprises a channel 43 between a source 41 and a drain 42. The channel 43 has an electrical conductivity that is dependent upon an electric field at the adjacent second conductive electrode 32.

The channel 43 is electrically insulated from the amplification electrode 30. This insulation may arise from the use of an ion-conducting material for the amplification electrode 30 as opposed to an electron-conducting material. Alternatively, where an electron conducting material is used for the amplification electrode 30 an electrically insulating layer such as a dielectric may be provided between the amplification electrode 30 and the electric field sensor 40.

The electric current through the channel 43 between source 41 and drain 42 is dependent on the second voltage V2 at the second conductive electrode 32, which is dependent upon the ratio of the first area 35 to the second area 36 and dependent upon the first voltage V1 generated at the first conductive electrode 31 by a change in polarization of the pyroelectric material 20.

FIG. 3 illustrates an insulated-gate electric field sensor 40. The second conductive electrode 32 forms a gate that is insulated from the channel 43 of the electric field sensor 40 by, in this example, a dielectric layer 44. The insulated-gate electric field sensor 40 operates as an insulated-gate field-effect transistor (IGFET). Although an IGFET is used as an electric field sensor 40, other electric field sensors 40 may be used.

In some but not necessarily all examples, the channel 43 may be a layer of graphene. The layer of graphene may be a monolayer. The source 41, drain 42 and channel 43 may be different portions of the same layer of graphene. Graphene responds to local electric fields by varying its conductivity like a semiconductor. In other examples different materials may be used. The materials used in the electric field sensor 40 may be any transconductive material which has an electrical conductivity which is dependent upon the local electric field.

In some examples the electric field sensor 40 may also be deformable and/or transparent.

Figure 4:
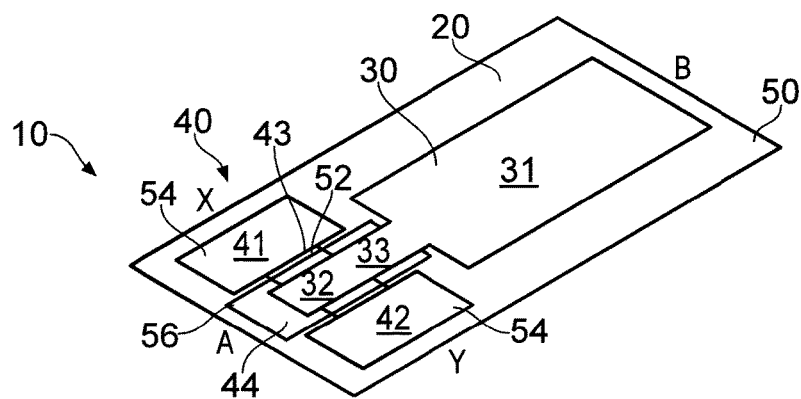
FIG. 4 illustrates a perspective view of an example of an apparatus using a electric field sensor.
Figure 5A:
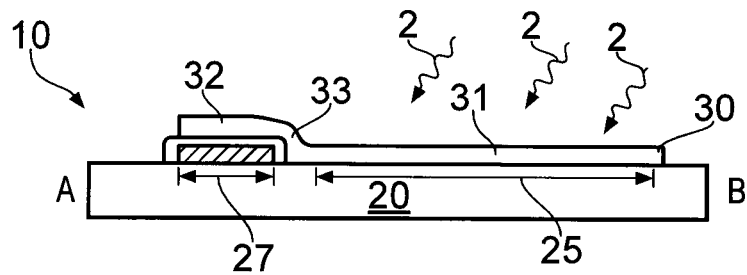
FIG. 5A illustrates a view of a transverse cross-section AB of FIG. 4
Figure 5B:
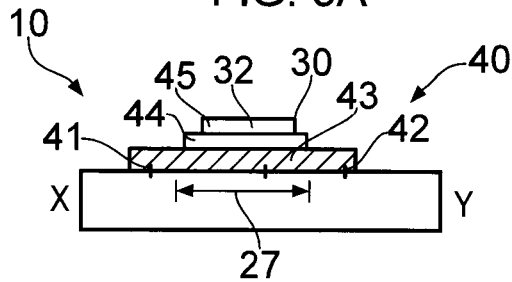
FIG. 5B illustrates view a transverse cross-section XY of FIG. 4.

FIG. 4 illustrates a perspective view of an apparatus 10, as previously described using a electric field sensor 40 as illustrated in FIG. 3. FIG. 5A illustrates a view of a transverse cross-section AB and FIG. 5B illustrates view a transverse cross-section XY.

In this example, the pyroelectric material 20 forms an underlying substrate 50. The electric field sensor 40 is formed on top of the pyroelectric substrate 50. The electric field sensor 40 comprises a channel 43 between a source 41 and a drain 42. The source 41, the channel 43 and the drain 42 may be provided by a layer of graphene 52.

Conductive terminals 54 may be applied to the source 41 and, separately, to the drain 42.

A dielectric layer 56 extends over at least the channel 43 of the graphene 52. The dielectric layer 56 will prevent electrical connection between the amplification electrode 30 and the graphene 52.

The amplification electrode 30 extends through a first area 35 to form the first conductive electrode 31 in contact with the pyroelectric substrate 50, extends through a second area 36 to form the second conductive electrode 32 separated by the dielectric layer 56 from the channel 43, and extends through an area between the first and second conductive elements 31, 32 to form the conductive interconnection 33.

The amplification electrode 30 may be patterned conductive material

In this example, the first conductive electrode 31 contacts the pyroelectric substrate 50. The contacting portion of the first conductive electrode 31 is designated as a first area 35 of the first conductive electrode 31. The equivalent contacting portion of the pyroelectric substrate 50 is designated a first area 25 of the pyroelectric material 20.

In this example, the channel 43 of the electric-field sensor 40 contacts the pyroelectric substrate 50 over a second area 27 of the pyroelectric material 20.

The second area 36 of the second conductive electrode 32 overlies the second area 27 of the pyroelectric material 20 but is separated from the pyroelectric material 20 by the graphene channel 43 and the gate dielectric 44.

The pyroelectric material 20 in this example is an insulator with no free charge. Therefore although the pyroelectric material 20 contacts the first conductive electrode 31 and the electric field sensor 40, it also electrically insulates the first conductive electrode 31 and the electric field sensor 40.

The channel 43 has an electrical conductivity that is dependent upon a second electric field at the adjacent non-contacting second conductive electrode 32 (top-gate) and that is dependent upon a third electric field at the adjacent and contacting second area 27 of the pyroelectric material 20 (bottom-gate).

Although graphene is used to define the channel 43, other materials may be used. Any material which may be manufactured in a thin film and positioned in contact with pyroelectric material 20 and which has an electrical conductivity which is dependent upon the local electric field may be used.

A short and narrow graphene channel 43 uses only a fraction of the available area of the pyroelectric substrate 50. It may have a resistance of ~1 kOhm. This is low enough to provide a good read-out, but still dominant over the series resistance of the contacts 54 that tend to decrease the sensitivity.

Figure 6:
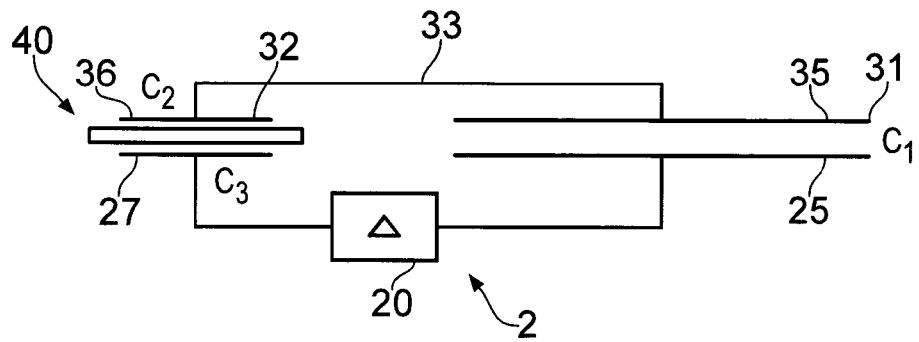
FIG. 6 illustrates an equivalent electrical circuit for the apparatus illustrated in FIG. 4 and FIGS. 5A and 5B.

FIG. 6 illustrates an equivalent electrical circuit for the apparatus 10 as illustrated in FIG. 4 and FIGS. 5A and 5B. It is similar to the equivalent circuit illustrated in FIG. 2. However, it differs in that the second area 27 of the pyroelectric material 20 forms a third capacitor C3, adjacent the electric field sensor 40, that generates a third electric field. The electric field sensor 40 senses a second electric field generated by the second capacitor C2 and a third electric field generated by the third capacitor C3.

In this example, absorption of photons 2 by the pyroelectric substrate or other parts of the apparatus 10 result in a temperature increase at the pyroelectric material 20.

The photons 2 absorbed by the apparatus 10 that result in a temperature increase in the pyroelectric material 20 may be photons in the infrared region of the electromagnetic spectrum. For example, the photons may have wavelengths between 5-14 µm. Detection of the infrared photons may be used to determine a temperature of the source of the photons or to image a source of the infrared photons.

In some examples the absorbed photons may be outside the infrared region of the spectrum. For example the incident photons may be in the visible region of the spectrum.

The apparatus 10 may comprise a photon absorbing layer for absorbing photons and generating heat the pyroelectric material 20. The photon absorbing layer may be formed from the pyroelectric material 20 or another part of the apparatus 10.

In some examples the pyroelectric material 20 may be a poor absorber of electromagnetic radiation and/or a poor thermal conductor. This may result in only a small change in temperature of the pyroelectric material 20 for a given amount of incident electromagnetic radiation.

In some but not necessarily all embodiments, the absorption of photons by the pyroelectric material 20 may be increased by micro-engineering the pyroelectric material 20 to form a photon absorbing layer that operates as an antenna for absorbing electromagnetic wavelength of a particular frequency or frequencies.

Figure 7A:
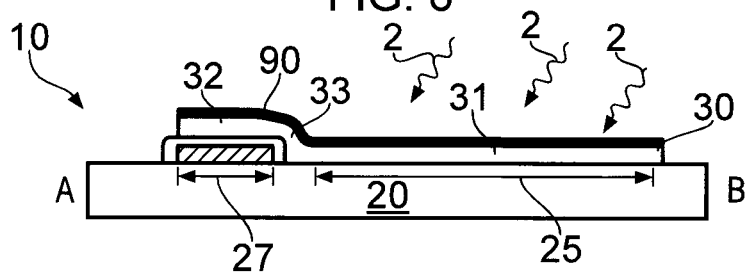
FIGS. 7A and 7B illustrate an apparatus similar to that illustrated in FIGS. 5A and 5B and comprising a photon absorbing layer overlying the pyroelectric layer.
Figure 7B:
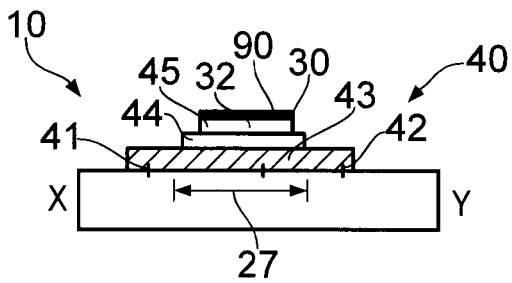

In some but not necessarily all examples, the apparatus 10 may comprise a photon absorbing layer 90 for absorbing photons and generating heat at the pyroelectric material 20 that is additional to the pyroelectric material 20. In the example of FIGS. 7A and 7B, the apparatus 10 is the same as the apparatus 10 illustrated in FIGS. 5A and 5B except that a photon absorbing layer 90 overlies the pyroelectric layer 20 and the amplifying electrode 30, at least the first conductive electrode 31 of the amplifying electrode 30. The photon absorbing layer 90 may be an infrared-absorbing polymer or dye.

Figure 8:
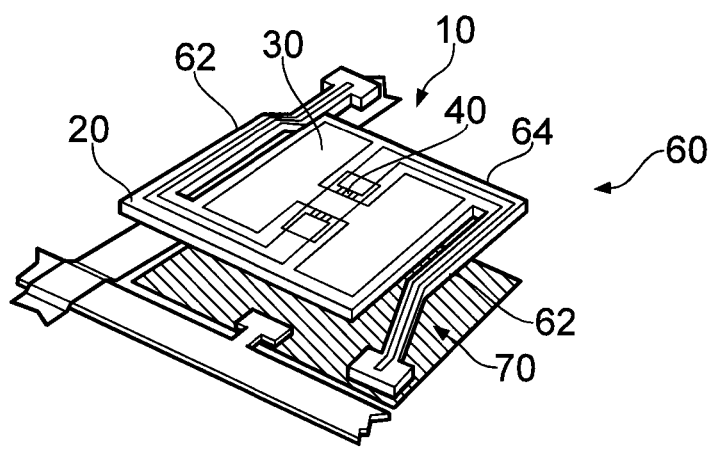
FIG. 8 illustrates an example of the apparatus configured as a suspended structure.

FIG. 8 illustrates an example of the apparatus 10, as described previously, configured as a suspended structure 60.

The suspended structure 60 is suspended above a lower substrate 70 via supports 62.

The suspended structure 60 may be formed by depositing successive patterned layers of a first material and a second material. The pattern of the second material builds up over multiple layers to form the suspended structure 60 surrounded by the first material. Selective removal of the first material and not the second material produces the suspended structure 60 as a free-standing structure with a void underneath a platform 64 suspended by supports 62.

The apparatus 10 may be defined on the upper surface of the suspended platform 64. Electrical interconnects between the apparatus 10 and the lower substrate 70 are formed on the supports 62.

The suspended platform 64 ensures a low thermal capacity as the thermal conductivity between apparatus 10 and lower substrate 70 is low. This ensures a maximum change in temperature for fixed incoming radiation. Some transfer of energy from the apparatus 10 occurs e.g. via the electrical interconnects to control the integration time of the sensor.

Figure 9:
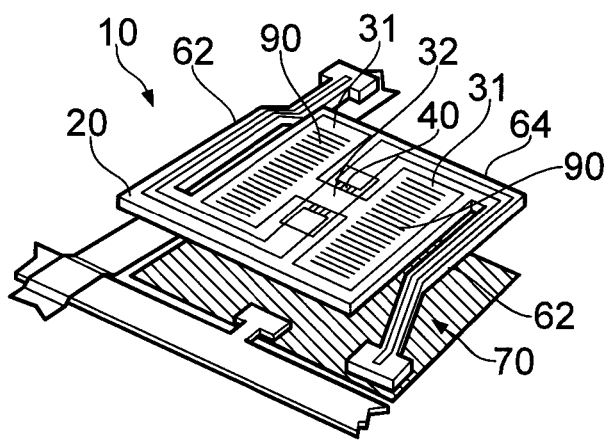
FIG. 9 is an apparatus comprising micro-engineered component(s)

FIG. 9 is an apparatus 10 similar to that illustrated in FIG. 8, however, the apparatus comprises a micro-engineered first conductive electrode 31 that operates as an antenna for absorbing photons of a particular frequency or frequencies. The micro-engineered first conductive electrode 31 is a photon absorbing layer 90.

Figure 10:
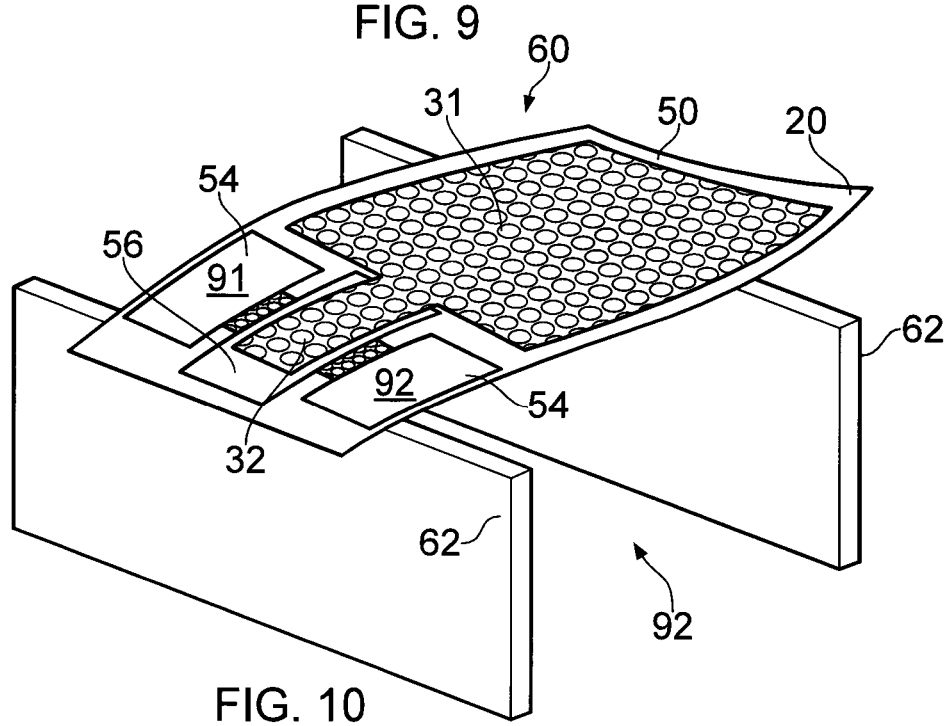
FIG. 10 illustrates an example of an apparatus configured as a suspended structure.

FIG. 10 illustrates an example of an apparatus similar to those described with reference to FIGS. 1 to 7. FIG. 10 illustrates an example of the apparatus 10 configured as a suspended structure 60.

In this example, the apparatus 10 is similar to the apparatus 10 described with reference to FIGS. 4 and 5A and 5B. However, in this example, components of the apparatus 10 are formed from two-dimensional (2D) materials.

The pyroelectric substrate 50 is a 2D material suspended over a trench 92.

The source 41, channel 43 and drain 42 of the electric field sensor 40 are formed from 2D material, for example, a monolayer of graphene.

The amplifying electrode 30 comprising the first conductive element 31, the second conductive element 32 and the conductive interconnection 33 are formed from a single piece of 2D material, for example, a monolayer of graphene.

Suitable pyroelectric 2D materials include, but are not limited to: BN, MoS2, WSe2, covalently functionalized graphene (e.g., Fluorographene).

The use of stiff 2D materials allows the simple creation of a suspended structure 60.

Figure 11:
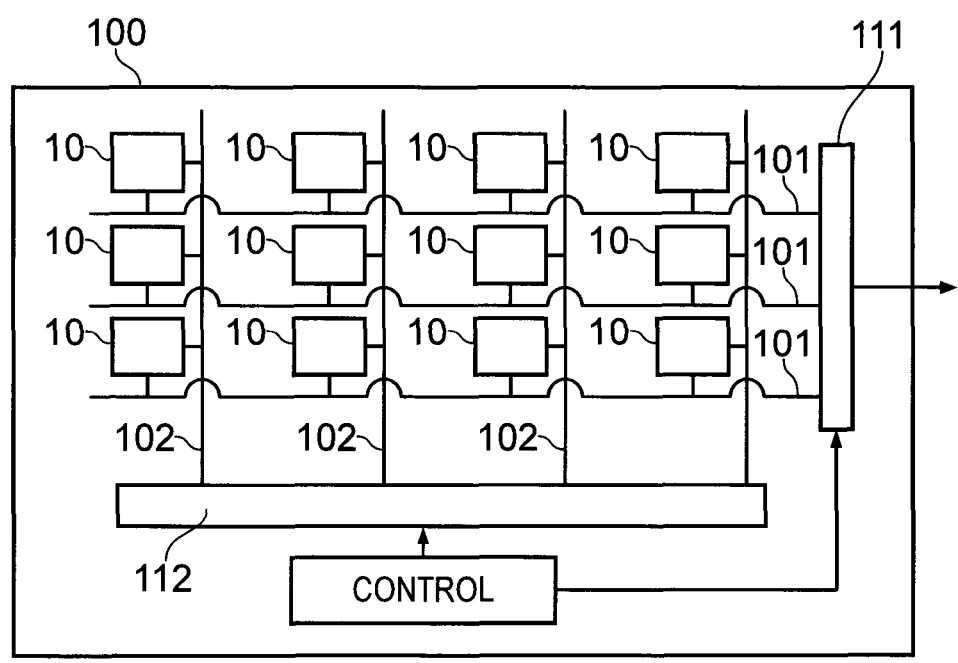
FIG. 11 illustrates a device comprising multiple apparatus.

FIG. 11 illustrates a device 100 comprising multiple apparatus 10 as previously described. The device 100 may, for example, be configured to operate as a photodetector, a microblometer, an infrared camera, a thermal imaging device or a heat sensor.

The device 100 comprises a plurality of apparatus 10. In the particular example of FIG. 11 twelve apparatus 10 are provided within the device 100. It is to be appreciated that any number of apparatus 10 may be provided in other examples.

The different apparatus 10 may be configured to sense photons of the same frequency or band of frequencies or to detect photons of different frequencies or bands of frequencies.

In some examples the device 100 may comprise some apparatus 10 which are configured to detect incident photons in the infrared region of the spectrum and some which are configured to detect incident photons in the visible region of the spectrum. This may enable the heating effect of the infra red radiation to be measured separately to the heating effect of the radiation in the visible region of the spectrum. This may enable the device 100 to be used as a thermal sensor even in daylight or when there a high levels of incident electromagnetic radiation in the visible region of the spectrum.

In the example illustrated the apparatus 10 are arranged as a regular array in rows and columns.

Each apparatus 10 in a row is connected to a particular row address line 101. Each row has a different row address line 101. Row addressing circuitry 111 enables one of the row address lines to be enabled at a time.

Each apparatus 10 in a column is connected to a particular column address line 102. Each column has a different column address line 102. Column addressing circuitry 112 enables one of the column address lines to be enabled at a time.

The electric field sensor 40 of a particular apparatus 10 may be read by enabling the particular column address line 102 the apparatus 10 is connected to and the particular row address line 101 the apparatus is connected to. The output from the electric field sensor 40 is indicative of the local temperature at that apparatus 10 which may be caused by incident photons.

In the foregoing description emphasis has been placed on an example that uses pyroelectric material 20 as a sensing material. However, other sensing materials may be used that have a polarization that changes in response to an applied actuation.

In the examples above, the sensing material 20 was pyroelectric material and the applied actuation was electromagnetic radiation.

However, in other examples, the sensing material 20 may be a piezoelectric material and the applied actuation may be deformation.

In the above description the term coupled means operationally coupled and any number or combination of intervening elements can exist including no intervening elements.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

Research leading to these results has received funding from the European Union Seventh Framework Programme under grant agreement n°604391 Graphene Flagship.

The invention claimed is:

1. An apparatus comprising:
a pyroelectric material;
a patterned conductive material overlying a first area of the pyroelectric material to form a first conductive electrode, and
an electric field sensor which comprises:
a channel between a source and a drain,
a dielectric layer which extends over the channel,
a gate which is insulated from the channel by the dielectric layer,
wherein
the channel contacts the pyroelectric material in a second area of the pyroelectric material, and
the patterned conductive material overlies the second area of the pyroelectric material to form a second conductive electrode which forms the gate in the electric field sensor,
wherein the first area is larger than the second area.

2. An apparatus as claimed in claim 1, wherein the pyroelectric material and the first conductive electrode form a first capacitor having a first electric field dependent upon a polarization of the pyroelectric material and wherein the first electric field causes, at the second conductive electrode, a second electric field that is dependent upon the first electric field amplified by a ratio of the first area to the second area.

3. An apparatus as claimed in claim 1, wherein the first area is at least ten times larger than the second area.

4. An apparatus as claimed in claim 1, wherein the channel comprises a layer of graphene.

5. An apparatus as claimed in claim 1, wherein a photon absorbing layer overlies the pyroelectric layer and comprises the first conductive electrode or overlies the first conductive electrode.

6. An apparatus as claimed in claim 5, wherein the photon absorbing layer is a micro-engineered layer that operates as an antenna for absorbing electromagnetic wavelength of a particular frequency or frequencies.

7. An apparatus as claimed in claim 1 configured as a suspended structure.

8. A device comprising multiple apparatuses as claimed in claim 1, wherein the device is configured to operate as a photodetector, a microbolometer, or an infrared camera.

* * * * *